United States Patent [19]

Chaffin, III et al.

[11] 4,110,489

[45] Aug. 29, 1978

[54] PREPARATION OF LOW ABSORPTION TRANSPARENT THALLIUM IODIDE FILMS ON POTASSIUM CHLORIDE

[75] Inventors: John H. Chaffin, III, Minnetonka; Richard A. Skogman, Inver Grove Hts., both of Minn.

[73] Assignee: Honeywell Inc., Minneapolis, Minn.

[21] Appl. No.: 804,665

[22] Filed: Jun. 8, 1977

[51] Int. Cl.$^2$ .............................................. G02B 1/10
[52] U.S. Cl. ................................. 427/164; 427/160; 427/162
[58] Field of Search ....................... 427/162, 164, 160

[56] References Cited

U.S. PATENT DOCUMENTS

| 3,959,548 | 5/1976 | Bernal | 427/164 X |
|---|---|---|---|
| 4,009,300 | 2/1977 | Chaffin | 427/162 |

*Primary Examiner*—James R. Hoffman
*Attorney, Agent, or Firm*—Omund R. Dahle

[57] ABSTRACT

A protective layer is prepared for water soluble optical elements. A process for obtaining clear thallium iodide (TlI) films of 1 to 2 micron thickness on potassium chloride (KCl) substrate. The high index of refraction (2.34 − 2.46 at 10.6 microns) makes this coating material attractive as a component in an antireflection system of coatings.

9 Claims, No Drawings

PREPARATION OF LOW ABSORPTION TRANSPARENT THALLIUM IODIDE FILMS ON POTASSIUM CHLORIDE

BACKGROUND AND SUMMARY OF THE INVENTION

This invention is concerned with surface protection of halide solids. In particular, this invention is concerned with the surface protection of water soluble halide solids for use in optical components in infrared systems. A thallium iodide has been demonstrated as an excellent protective high index coating material for potassium chloride laser windows. TlI has a high refractive index and an optical absorption of less than 1 cm$^{-1}$ at 10.6 microns. The protective quality of TlI lies in its insolubility and remarkable adhesion to potassium chloride.

Other patents assigned to the same assignee as the present application and dealing with protective coatings on water soluble halide optical elements are U.S. Pat. Nos. 4,009,300 and 3,959,548.

In the past thallium iodide films vacuum deposited on potassium chloride substrates, in thickness about 1 to 2 microns sufficient for infrared antireflection coatings, have been very cloudy due to the scatter of visible light by a birefringement epitaxial thallium iodide microstructure.

The adhesion referred to is due, in part, to the epitaxial growth of TlI on KCl. TlI microstructures resulting from different epitaxial growth habits are responsible for the optical scattering observed in films grown on certain KCl orientations.

We have found that the alignment of the TlI $b_o$ axis parallel to the KCl <110> direction nearest the substrate surface determines the epitaxial growth habit. On the precise KCl (100) orientation, for example two KCl <110> directions lie in the surface. This causes the TlI to nucleate in two orientations rotated 90° from one another. This unusual microstructure results in scattering by the diffraction of light passing from one biaxially birefringement orientation to another.

More specifically, the cloudiness in films on these crystals occurs in specific crystallographic regions. A lens-shaped crystal, for example, is cloudy along the two KCl <100> directions projected from the KCl <100> pole. These cloudy regions contain the microstructure mentioned previously and divide the lens into four quadrants. The entire lens was studied between crossed polarizers. With the KCl <100> directions parallel to the polarizer axes only the microstructural boundaries are extinguished. As the crystal is rotated with respect to the polarizers the entire film is extinguished when the KCl <110> directions become parallel to the polarizer axes. This implies that the TlI contains, at most, two orientations, both of which have their optic axes parallel to the two KCl <110> directions. The fact that boundaries appear means that there are indeed two TlI orientations.

X-ray Laue photos were taken on both sides and in the middle of the cloudy region along the KCl <100> direction to confirm the existence of the two TlI orientations.

Discrete spots observed on the Laue photos were evidence of the epitaxial growth of TlI on KCl. Further X-ray analysis details this epitaxy and provides a model for the observed microstructures.

In every case analyzed the TlI $b_o$ axis is aligned parallel to a KCl <110> direction. This suggests the importance of the KCl <110> direction that was noted under polarized light. Observation of orientations away from the principle orientations reveals that the TlI $b_o$ axis aligns itself with the KCl <110> direction nearest the substrate surface. Recalling the lens shaped crystal we realize that this alignment is the cause of the two orientations and their intersection along the <100> projection on the lens. This intersection has both KCl <110> directions equally near the surface. On exact KCl (100), which includes cleaved KCl, both <110> directions are in the surface plane and films on these surfaces contain the duplex microstructure and are cloudy.

In the present invention for vacuum depositing of low absorption transparent thallium iodide film on potassium chloride we have been able to eliminate the tendency for epitaxial growth to occur as a solution to the problem of cloudy coating. We have found that when TlI is condensed in its cubic ($\beta$) phase on KCl and allowed to transform to its stable orthorhombic ($\alpha$) phase a clear, polycrystalline, randomly oriented film develops independent of substrate orientation.

The condensation of the $\beta$ phase is accomplished by holding the substrate at 140° C. or above during the deposition. The phase change occurs during substrate cooling with the grain size being dependent on the condensation temperature and cooling rate.

At elevated substrate temperatures and low deposition rates, however, TlI will not condense on the KCl. Use of higher evaporation rates solves this problem. By using a graphite Knudsen style evaporation source we have achieved more uniform heating of the TlI and are able to successfully deposit films at rates over 3000Å per minute.

Films prepared in this manner at an arbitrary rate of 2000 Å/min. are not cloudy, have low absorptions, and have withstood the laser damage tests.

This fabrication technique is especially compatible with the subsequent high temperature deposition of low index coatings.

DESCRIPTION

This invention defines a process which destroys the epitaxial growth tendency of thallium iodide (TlI) on potassium chloride (KCl) and thereby eliminates the undesirable microstructure and the resultant light scattering. In this process the orientation of the KCl is no longer significant or critical. The KCl substrate temperature is raised so that the TlI condenses in its high temperature cubic phase. During cooling, the TlI transforms to its stable orthorhombic phase and develops a non-epitaxial and, hence, nonscattering microstructure. In order to cause the TlI to condense and stick to the high temperature KCl the TlI is deposited at a high rate. To prevent TlI decomposition and subsequent increase in optical absorption a Knudsen style evaporation source is used to obtain a high evaporation rate.

Considering this process in more detail, in one successful embodiment of this process a clean KCl substrate was placed into a substrate holder contained in a bell jar vacuum thermal evaporation system. The substrate holder included electrical resistive type heating means for the KCl substrate. High purity TlI (99.999%) was filled into a Knudsen style evaporation source (a suitable non-chemically reactive isothermal enclosure with a small orifice). The non-chemically reactive material may be, for example, graphite or alumina. The Knudsen source is placed in the bell jar so that the subliming TlI is generally directed towards the KCl substrate from the source. In this embodiment the substrate was in the upper portion of the vacuum chamber and the source in the bottom portion, the two being separated by about 15 inches. This spacing, while not critical, was sufficient to provide a uniform coating of the substrate surface with TlI. A deposition rate sensing means was located near the KCl substrate, and an adjustable shutter was located between the source and substrate to shield the substrate from the source except during desired deposition periods. The evaporation system containing source, shutter, substrate, and deposition sensing means was then evacuated to less than 1 × 10$^{-6}$ Torr, the KCl substrate was heated to about 140° C., the source was heated to outgas the TlI and then the source temperature was raised to obtain a deposition rate of about 2000Å per minute at the deposition sensing means. The shutter was then opened and the desired film thickness of 1–2 microns was deposited on the KCl. The temperature of the source during deposition is about 170° C. or in the range of about 170° C. to 200° C. The deposition rate is a function of the temperature of the source. The deposition rate should be at least 500Å per minute. As stated above, the rapid deposition rate is an important aspect of this invention. When the desired film thickness is obtained the shutter is closed, the evaporator heater and the substrate heater are turned off allowing the coated substrate to cool. The cooling rate is not critical.

The embodiments of the invention in which an exclusive property or right is claimed are defined as follows:

1. A method of depositing an optical film of thallium iodine in its cubic phase on potassium chloride optical elements and thereafter allowing the thallium iodide film to transform to its stable orthorhombic phase to thereby provide a clear, polycrystalline, randomly oriented film the improved method comprising:

heating in an evacuated chamber an optical substrate of potassium chloride to about between 140° C. and about 170° C.; and, heating in the same chamber an evaporation source of thallium iodide to a sufficiently high temperature to provide a deposition rate of at least 500Å per minute onto said potassium chloride substrate, the thallium iodide being deposited in its cubic phase.

2. The method of claim 1 wherein said evaporation source is heated to the range of about 170° C. to about 200° C.

3. The method of claim 2 wherein said evaporation source is heated to about 170° C.

4. A method of vapor depositing an optical coating of thallium iodide on potassium chloride optical elements, the improved method comprising:

providing a vacuum thermal evaporation system;

providing a potassium chloride substrate in said system;

providing a source of high purity thallium iodide in a suitable non-chemically reactive isothermal evaporation source enclosure with a small orifice in said system;

providing heating means for said substrate;

providing heating means for said isothermal enclosure;

evacuating said evaporation system to a pressure less than 10$^{-5}$ Torr, heating said substrate to about 140° C. and heating said evaporating source to provide a fast deposition rate of about at least 500Å per minute of said thallium iodide on said potassium chloride substrate.

5. The method of claim 4 wherein said evaporation source is heated to the range of about 170° C. to about 200° C.

6. The method of claim 5 wherein said evaporation source is heated to about 170° C.

7. The method of claim 1 wherein said optical substrate is heated to about 140° C.

8. The method of claim 1 wherein said deposition rate is about 2000Å per minute.

9. The method of claim 4 wherein said deposition rate is about 2000Å per minute.

* * * * *